(12) United States Patent
Tanaka et al.

(10) Patent No.: US 6,747,239 B2
(45) Date of Patent: Jun. 8, 2004

(54) PLASMA PROCESSING APPARATUS AND METHOD

(75) Inventors: Junichi Tanaka, Tsuchiura (JP); Hiroyuki Kitsunai, Niihari (JP); Ryoji Nishio, Mito (JP); Seiichiro Kanno, Niihari (JP); Hideyuki Yamamoto, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/437,030

(22) Filed: May 14, 2003

(65) Prior Publication Data

US 2003/0192864 A1 Oct. 16, 2003

Related U.S. Application Data

(63) Continuation of application No. 09/791,732, filed on Feb. 26, 2001, now Pat. No. 6,590,179.

(30) Foreign Application Priority Data

Sep. 22, 2000 (JP) ........................................ 2000-289303

(51) Int. Cl.[7] .............................................. B23K 10/00
(52) U.S. Cl. ............................ 219/121.43; 219/121.41; 219/121.42; 156/345.24; 156/345.25; 216/67; 438/9
(58) Field of Search ........................ 219/121.43, 121.41, 219/121.4, 121.42, 121.54, 121.57, 121.59; 700/121; 156/345.24, 623.1, 626.1, 345.25; 438/9; 216/60–67

(56) References Cited

U.S. PATENT DOCUMENTS

| 4,491,499 A | 1/1985 | Jerde et al. |
| 4,695,700 A | 9/1987 | Provence et al. |
| 5,442,562 A | 8/1995 | Hopkins et al. |
| 5,467,883 A | 11/1995 | Frye et al. |
| 5,658,423 A | 8/1997 | Angell et al. |
| 5,864,773 A | 1/1999 | Barna et al. |
| 6,153,115 A | 11/2000 | Le et al. |
| 6,157,867 A | 12/2000 | Hwang et al. |

FOREIGN PATENT DOCUMENTS

| JP | 10-125660 | 5/1998 |
| JP | 87323 | 3/2000 |
| JP | 2000-289303 | 9/2000 |

*Primary Examiner*—Mark Paschall
(74) *Attorney, Agent, or Firm*—Antonelli, Terry, Stout & Kraus, LLP

(57) ABSTRACT

A plasma processing apparatus having a process chamber to process specimens; a status detecting unit for detecting the internal processing status of the process chamber and outputting a plurality of signals; and a signal converting unit for extracting an arbitrary number of signal processing filters from a signal filter database using a signal filter selector and creating an arbitrary number of device status signals. The signal converting unit creates fewer effective device status signals of a time series from the output signals.

15 Claims, 8 Drawing Sheets

FIG. 5(a) WHEN A SIGNAL FILTER IS CREATED

FIG. 5(b) WHEN A SIGNAL FILTER IS USED

FIRST SIGNAL FILTER ⇔ PLASMA DENSITY

SECOND SIGNAL FILTER ⇔ DISSOCIATION OF HBr

THIRD SIGNAL FILTER ⇔ SURFACE REACTION OF Br AND Si

FOURTH SIGNAL FILTER ⇔ RATIO OF H TO Br

PLASMA PROCESSING APPARATUS AND METHOD

CROSS-REFERENCE TO RELATED APPLICATION

The present application is a continuation of application Ser. No. 09/791,732 filed on Feb. 26, 2001 now U.S. Pat. No. 6,590,179, the contents of which are incorporated by reference herein.

BACKGROUND OF THE INVENTION

This invention relates to an apparatus having a plasma generating mechanism and to a plasma processing method thereof; and, more particularly, the invention relates to a plasma processing apparatus, which is applicable for use in the fine processing of semiconductor devices, such as semiconductor manufacturing equipment and LCD equipment, and to a working method thereof.

Recent semiconductor processing technologies have been required to have finer processing performance and higher production accuracy. Further, the conventional plasma apparatus, which decomposes process gases by use of a plasma and physically processes semiconductor wafers, cannot be free from the deposition of reaction products on the inner wall of the plasma chamber of the apparatus. This inevitable deposition of a reaction product tends to substantially affect the processing status of wafers. As wafer processing technology advances, this influence becomes greater and the resulting patterns on the semiconductor devices tend to vary, even through the input conditions of the apparatus are kept identical. In other words, this makes the production unstable.

To solve this problem, conventional methods have employed cleaning of the inner walls of the chamber by plasma or controlling of the temperature of the chamber walls so that the reaction products will not deposit thereon. However, most of these methods are not sufficient to keep the wafer processing status identical, so that the wafer processing status keeps on varying gradually as the processing advances from wafer to wafer. Before the products are seriously affected, the plasma processing apparatus must be disassembled for parts replacement and wet cleaning, sometimes using ultrasonic waves. Besides the depositions on the chamber walls, the wafer processing status is also affected by various factors of the processing system, such as temperature. Therefore, various ideas have been employed to eliminate such influences. For example, detecting transitions in the processing status of the plasma processing apparatus and cleaning the chamber according to the result of detection, and feeding back the result of detection to the plasma processing apparatus to keep the processing status constant, have been proposed.

A method of monitoring transitions in processing status of the plasma processing apparatus is disclosed for example by Japanese Patent Publication No. 10-125660 (1998). This method of estimating the performance of an apparatus or diagnosing the plasma status uses a relational expression between plasma processing characteristics and the electric signals of the apparatus. More particularly, the method contains a step of determining an approximate equation expressing the relationship between three electric signals and the plasma processing characteristics of the apparatus in a major regression analysis manner.

Another method is disclosed in Japanese Patent Publication No. 11-87323 (1999). This method employs an existing detecting system comprising a plurality of sensors in the plasma processing apparatus and monitors the device status according to the relationship of the signals from the sensors. Further, this example employs an expression using ratios of six electric signals as a method of creating a relational signal.

Another method is disclosed in U.S. Pat. No. 5,658,423. This method involves taking a lot of signals from a light and mass spectrometer, creating a relational signal thereof, and monitoring the device status with the relational signal. This involves the use of a principal component analysis method as a method to create this relational signal.

However, the method disclosed by Japanese Patent Publication No. 10-125660 (1998) has hardly been put in actual use because the method determines an approximate equation expressing the relationship between three electric signals and plasma processing characteristics of the apparatus on a map which varies input values of part of many processing conditions and requires a measurement of processing characteristics using many wafers. Further, if a plasma input value which is not taken into consideration in the measurement changes, the estimated model expression cannot be used. Furthermore, this method must measure processing characteristics of an enormous number of wafers to reflect a processing characteristic which is difficult to measure and is dependent upon internal conditions (such as the thickness of deposition films which continuously increase as the wafer processing continues) upon the model expression. This makes the method more difficult to be put in practical use.

Additionally, the method disclosed in Japanese Patent Publication No. 11-87323 (1999) is a general method which uses a technique of relating a plurality of well-known detecting means to a plurality of detection signals for diagnosis. Further, the disclosed method of calculating the ratios of some signals for relationship is one of the conventional methods, and it is very difficult to apply the method to a plasma processing system which has various process states dependent upon various factors which are subject to fluctuation.

Unlike this, the method in U.S. Pat. No. 5,658,423 discloses a method of analyzing main components of a lot of data obtained from devices, obtaining device status changes, and thus monitoring plasma states. However, this method still has more items to be improved before being applied to actual plasma processing systems, which must process wafers having various device structures under various conditions.

SUMMARY OF THE INVENTION

Accordingly, it is an object of the present invention to provide a method of monitoring a plasma processing apparatus, whose status varies depending upon processing conditions and upon a total number of processed wafers. Further, in this monitoring method, a few items of useful information are extracted from a lot of detection signals automatically, to provide an easy-to-use process monitoring method. A plasma processing apparatus using such a monitoring method and a method of producing devices, such as semiconductor devices and LCD devices, are provided.

In order to attain the above object, a characteristic of the present invention is to provide a plasma processing apparatus having a process chamber to process specimens, comprising: a status detecting unit which detects the processing status of the inside of the process chamber and outputs a plurality of signals, and a signal converting unit which extracts an arbitrary number of signal processing filters from a signal filter database by a signal filter selector means and creates as many device status signals as the filter selected; wherein the signal converting unit creates device status signals having a time series which are less than the output signals.

Another characteristic of the present invention is to provide a mechanism which inputs device status signals and controls devices therewith.

A further characteristic of the present invention is to display the status change of the device signals in accordance with time on a display unit.

A further characteristic of the present invention is to provide means for dividing plasma light by wavelengths as the status detecting unit.

Still another characteristic of the present invention is to provide means for detecting electrical states of arbitrary points in the plasma processing apparatus including plasma as the status detecting unit.

A further characteristic of the present invention is to provide means for dividing electrical status signals by frequencies.

Yet another characteristic of the present invention is to cause the status detecting unit to detect reflected power components when the plasma processing apparatus has a unit for supplying power to the process chamber as plasma generating means.

A more particular characteristic of the present invention is to provide means for adding optical signals to plasma; wherein the status detecting unit detects signals which change while the optical signals pass through the plasma or when the optical signals are reflected by the plasma.

Still another characteristic of the present invention is to provide means for adding electrical signals to the plasma; wherein the status detecting unit detects signals which change while the electrical signals pass through the plasma or when the electrical signals are reflected by the plasma.

A further characteristic of the present invention is to use eigen vectors obtained by principal component analysis of the result of specimen processing the signal filters.

Yet another characteristic of the present invention is to combine eigen vectors obtained by the principal component analysis of the result of specimen processing into a vector and to use the same as the signal filters.

A more particular characteristic of the present invention is to update the database using the result obtained in the processing of some specimens.

Still another characteristic of the present invention is to update the database using data obtained by processing particular specimens (called dummy wafers) in a preset process sequence.

A further characteristic of the present invention is to provide a mechanism to monitor how the database is updated in the plasma processing apparatus.

A further characteristic of the present invention is to stop the use of a certain status detecting means, or to remove the certain status detecting means from the plasma processing apparatus, after the database is created.

Yet another characteristic of the present invention is to obtain or update the database by use of external communication.

A more particular characteristic of the present invention is to provide means for selecting one or more signal filters according to tags, such as numbers or names assigned to the signal filters, wherein the selected signal filters are used to display, output, and control the device status signals of the signal converting unit.

Still another characteristic of the present invention is to provide a list of pre-named device conditions and a mechanism for selecting one named device condition from the device condition list using the device status signals and displaying and outputting named device conditions.

A further characteristic of the present invention is to provide a plasma processing apparatus, wherein the number of device status signals to be output or displayed varies according to the status of devices on the specimens.

A further characteristic of the present invention is to provide a plasma processing apparatus, wherein the number of device status signals to be output varies in response to external requests (from outside the plasma processing apparatus).

Yet another characteristic of the present invention is to provide a judging mechanism which checks whether each device status signal is in a preset range and changes the operating status of the plasma processing apparatus (e.g. cleaning the apparatus, replacement of parts, or start of wafer processing) according to the result of judgment.

A more particular characteristic of the present invention is to provide means for selecting types of specimens to be processed, among specimens requiring a different level of processing accuracy in a single plasma processing apparatus.

DETAILED DESCRIPTION OF PREFERRED EMBODIMENTS

Various embodiments of the present invention will be explained in detail with reference to the accompanying drawings.

Figure 1:
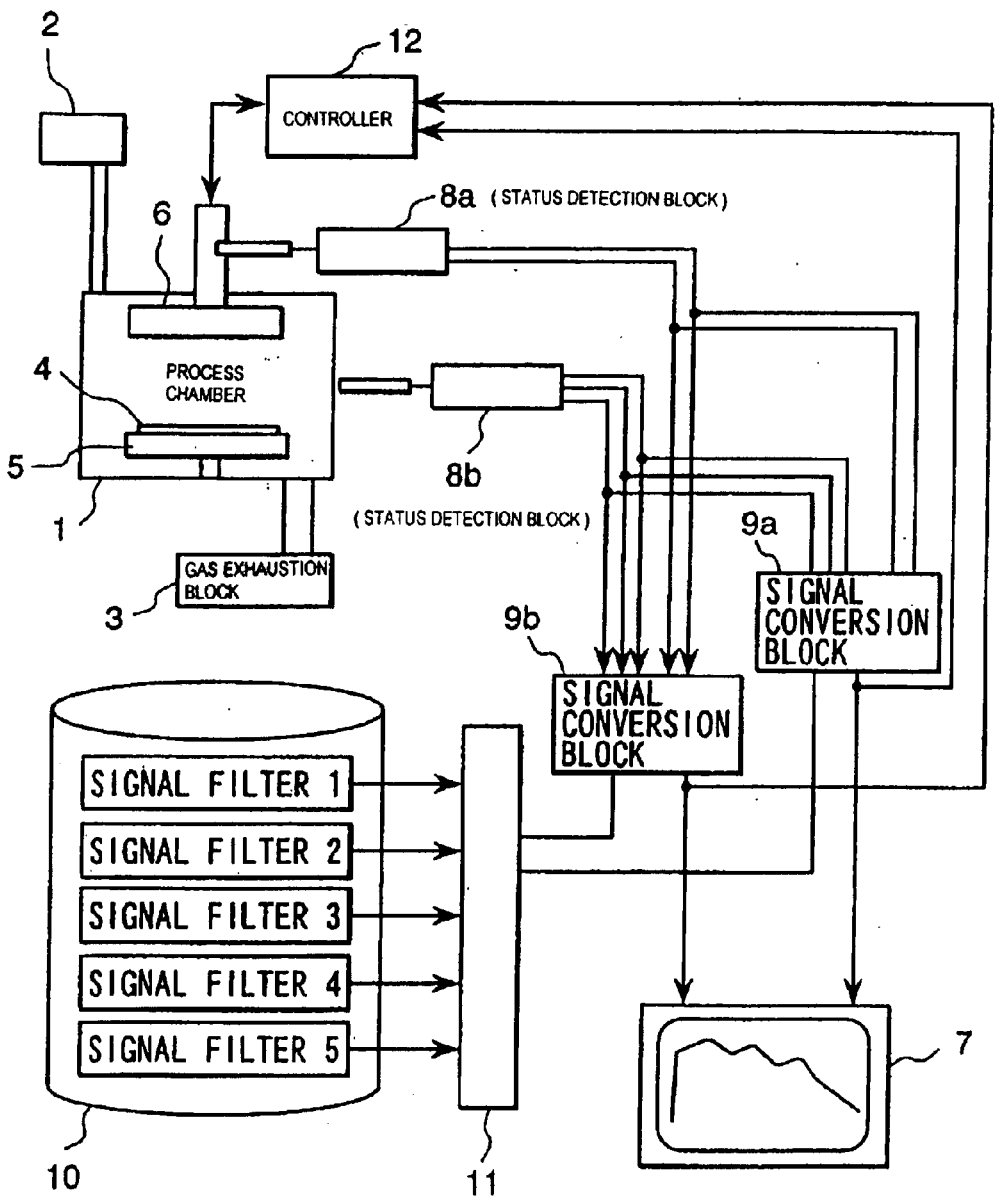
FIG. 1 is a schematic block diagram of one embodiment of the present invention.

FIG. 1 shows a first embodiment of the present invention. FIG. 1 is a schematic block diagram of a plasma processing apparatus equipped with a monitoring system. A process chamber 1 contains a gas supply means 2 to supply gases into the chamber, a gas exhausting means 3 which functions to exhaust the process gas and control the gas pressure in the chamber, a table 5 on which a specimen 4 to be processed is placed, and a plasma generating means 6 which generates a plasma in the chamber. The specimen 4 is a wafer in a semiconductor processing apparatus or an LCD device in an LCD manufacturing apparatus, for example.

Device status detecting means 8a and 8b are added to this plasma processing apparatus. The status detecting means 8a is, for example, a current or voltage detector placed in a circuit which supplies power to the plasma generating means 6. The status detecting means 8a can be a current- or voltage-phase difference detector, a power forward-wave or reflected-wave detector, or an impedance monitor. When AC power is supplied to the plasma generating means 6, the status detecting means 8a needs to have a mechanism which Fourier-transforms the detected current or voltage, and creates and outputs a few to tens of signals classified by frequency. An electric status detector, such as the status detector 8a, can be placed in any of the plasma generating means 6, the specimen table 5, and the process chamber 1. Further, the electric status detector can be connected to the output of a plasma probe inserted into the process chamber 5.

The device detecting means 8b is a spectrometer which detects light emitted from the plasma which is generated by the plasma generating means 6 in the process chamber 1. The device detecting means 8b can be a detector for detecting light of a single wavelength, such as a monochrometer. The optimum detecting means is a detector which can output a plurality of signals, such as a spectrometer which outputs emission spectrum divided into plural wavelengths. The emission spectrum output from the spectrometer comprises a plurality of signals of some hundred channels to some thousand channels (at their intensities) in accordance with the wavelengths thereof.

The status detecting means can be any other means in addition to the above, for example, a gas flow meter installed in the gas supplying means or a mass spectrograph installed in the process chamber. Further, the status detecting means can be a laser induced fluorescent means or an infrared absorption means which detects the transition of light passing through or reflected by plasma in the process chamber. Furthermore, the status detecting means can be a means, such as an active probe which detects responses of the apparatus to electric signals supplied from the outside. These status detecting means output device status signals periodically at preset time intervals or at predetermined sampling timings.

The signals output from the status detecting means 8a and 8b are fed to the signal converting means 9a and 9b, which have a function of receiving a plurality of signals from the status detecting means, such as 8a and 8b, converting the signals into one signal, and outputting the signal. The signal converting means can have one or more outputs, but the number of outputs must be less than the number of inputs. For example, let's assume that a total of 1000 signals are fed from the status detecting means to the signal converting means and that these signals are collected into one input signal vector "s." "s" is expressed by $$s=\{s1, s2, \ldots, s1000\}$$

Further, let's assume that a filter vector "f" representing signal filters is defined as follows:

$$f=\{f1, f2, \ldots, f1000\}$$

The signal converting means operates to calculate the scalar product of the input signal vector "s" and the filter vector "f" and outputs the result as one output signal "z." (Formula 1)

$$z = \sum_{i=1}^{1000} (s_i * f_i) \quad \text{Formula 1}$$

The signal converting means 9a and 9b generate different signals as they have different filter vectors. Although the system has a database 10 capable of storing signal filters, this embodiment singly stores filter vectors in this database. Further, this system has a signal filter selecting means 11 which selects signal filters from the database 10 and sends them to the signal converting means 9a and 9b. Signal filters can be selected according to the wafer processing condition. For example, the signal filters in the etching apparatus are replaced when a film on a wafer to be processed (for gate etching, metal etching, or insulator etching) changes. Usually, a single apparatus is dedicated for the processing of one type of film on a wafer. However, wafer surface layers need different process conditions according to device structures. Therefore, signal filters can be replaced each time the process condition changes. Further, when the process condition of a single wafer comprises plural process steps, signal filters can be replaced for each process step. Further, signal filters can be replaced for a cleaning or aging process which is sometimes performed between etching processes.

In this specification, the signals output from the signal converting means are called device status signals. Since the device status signals are output every moment, it is preferable to graphically display the change of signals with time on the display unit 7 so that the operator can check the device states. Further the system can provide a mechanism which feeds the device status signals back to a device controller 12 for controlling device process conditions, such as pressures and power, and which causes the controller 12 to automatically control the device states when the state changes. The controller 12 can control process conditions in real time or gradually for each specimen.

A method of generating signal filters will be described. The signal converting means sometimes receives a few input signals, but when an emission spectrum is used as the input, the signal converting means receives some hundred to some thousand signals. Therefore, it is not inconsistent with reality to determine individual elements of a filter vector which is used to process such a plurality of signals. Therefore, a principal component analysis is used for creation of the signal filters. This analytic method is a statistical method and its concrete calculating methods are disclosed, for example, in "Multivariate analysis" (by Okuno, etc. Japan Union of Science Engineering Publishing, 1971). A "m H n" signal matrix "S" (see Formula 2) is made up with "m" rows of input signal vector "s" containing "n" input signals.

$$S = \begin{Bmatrix} \boxed{S_{11} S_{12} S_{13} \ldots S_{1n}} \\ \boxed{S_{21} S_{22} S_{23} \ldots S_{2n}} \\ \vdots \\ \boxed{S_{m1} S_{m2} S_{m3} \ldots S_{mn}} \end{Bmatrix} \quad \text{Formula 2}$$

1st row of signal vector m-th row of signal vector

By creating a correlation matrix or covariance matrix "X" of the signal matrix "S" and analyzing eigen values of the "n×n" symmetric matrix "X," we can obtain n pieces of positive real eigen values {λ1, λ2, ... λn} and n pieces of eigen vectors {y1, y2, ..., yn} related to eigen values. The eigen values λ1>λ2>λ3>λn are arranged in the descending order of values (λ1 is the greatest and (n is the smallest).

The eigen vector "y" is a one-dimensional vector of "n" rows. By calculating the formula 1 using this eigen vector as said filter vector "f," we can obtain a signal filter which converts "n" pieces of input signals into one device status signal. The meanings of the eigen vector will be explained assuming that the emission spectrum is used as the input signals. The emission spectrum represents the state of the plasma and the state of atoms and molecules in the process chamber. Atoms and molecules respectively have emission peaks at their particular wavelengths. The emission spectrum data of some hundred channels to some thousand channels has a lot of emission peaks (some dozens) and conventional methods select some emission peaks to monitor the transition in their heights. Signal filters by characteristic vectors (by principal component analysis) have an effect to collect emission peaks having a close correlation from all signals. Therefore, they are highly sensitive to changes of signals and they can reduce noise components as a lot of signal data is totaled by Formula 1. This is one 14-of the advantages of the principal component analysis.

Collection of emission peaks of a close correlation is also helpful, for example, to induce a type of chemical reaction proceeding in the chamber. For example, when silicon Si is etched by hydrobromic acid HBr, a chemical reaction Si+Br 6 SiBr takes place on the surface of the silicon. As a result, bromine Br reduces in the gas phase and silicon bromide SiBr increases in the gas phase. In other words, the emission peak of bromine Br becomes shorter and the emission peak of SiBr goes higher. As these peaks are closely correlated, the principal component analysis will collect them into an identical eigen vector.

Figure 2:
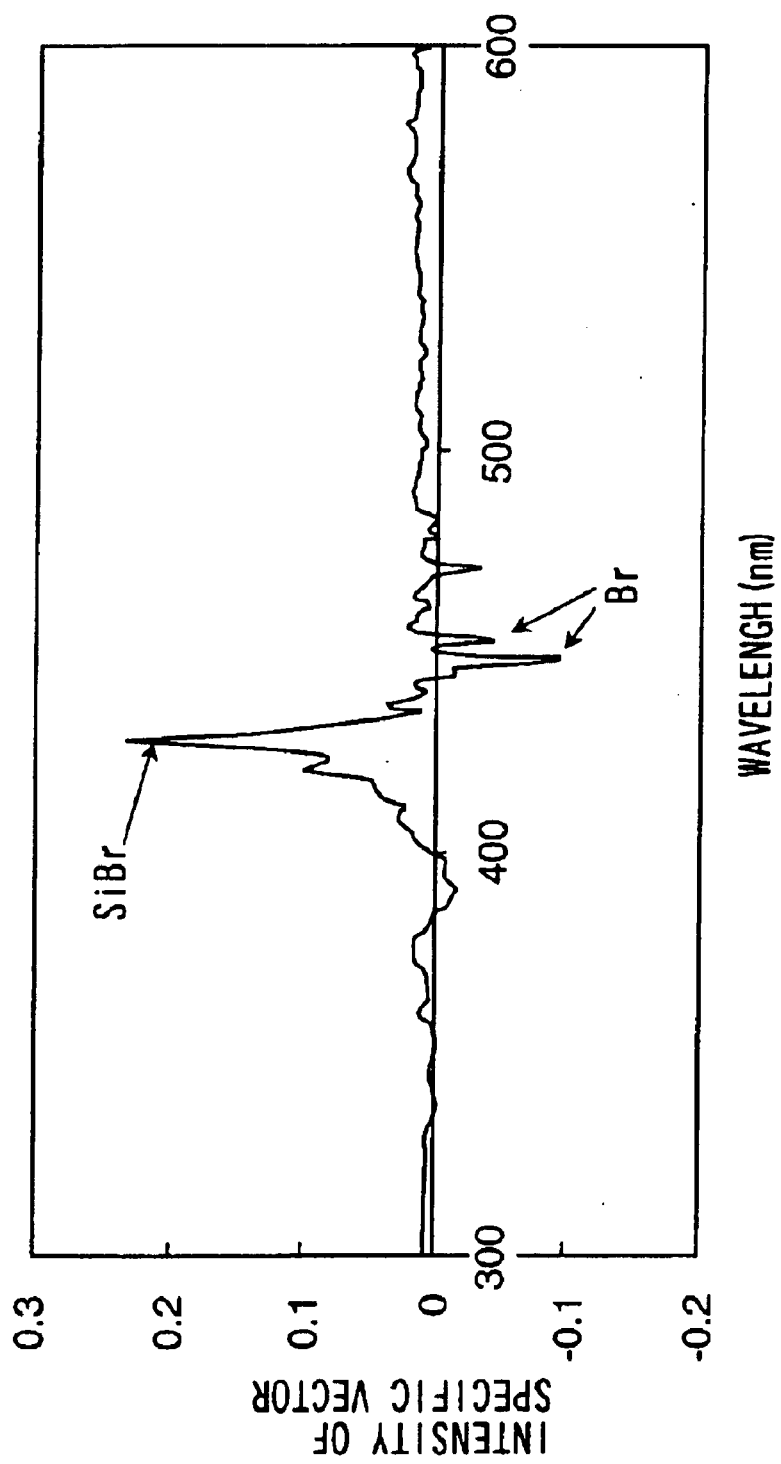
FIG. 2 is a graphic representation of a specific vector in the operation of a signal filter of the present invention.

FIG. 2 shows an example of an eigen vector which was obtained by actual processing. As shown in FIG. 2, meanings can be actually given to eigen vectors. However, in some cases, a combination of some characteristic vectors will make their physical-chemical meanings clearer.

Formula 3 shows an example of combining characteristic vectors "yi" and "yj" using two coefficients "αi" and "αj" into a new filter vector "fx."

$$f_x = \alpha_i y_i + \alpha_j y_j \quad \text{Formula 3}$$

Necessarily, two or more eigen vectors can be combined and signal filters need not always be eigen vectors. Signal filters can be any form of vector that is assumed to be substantially related to the physical phenomena to be monitored.

Figure 3:
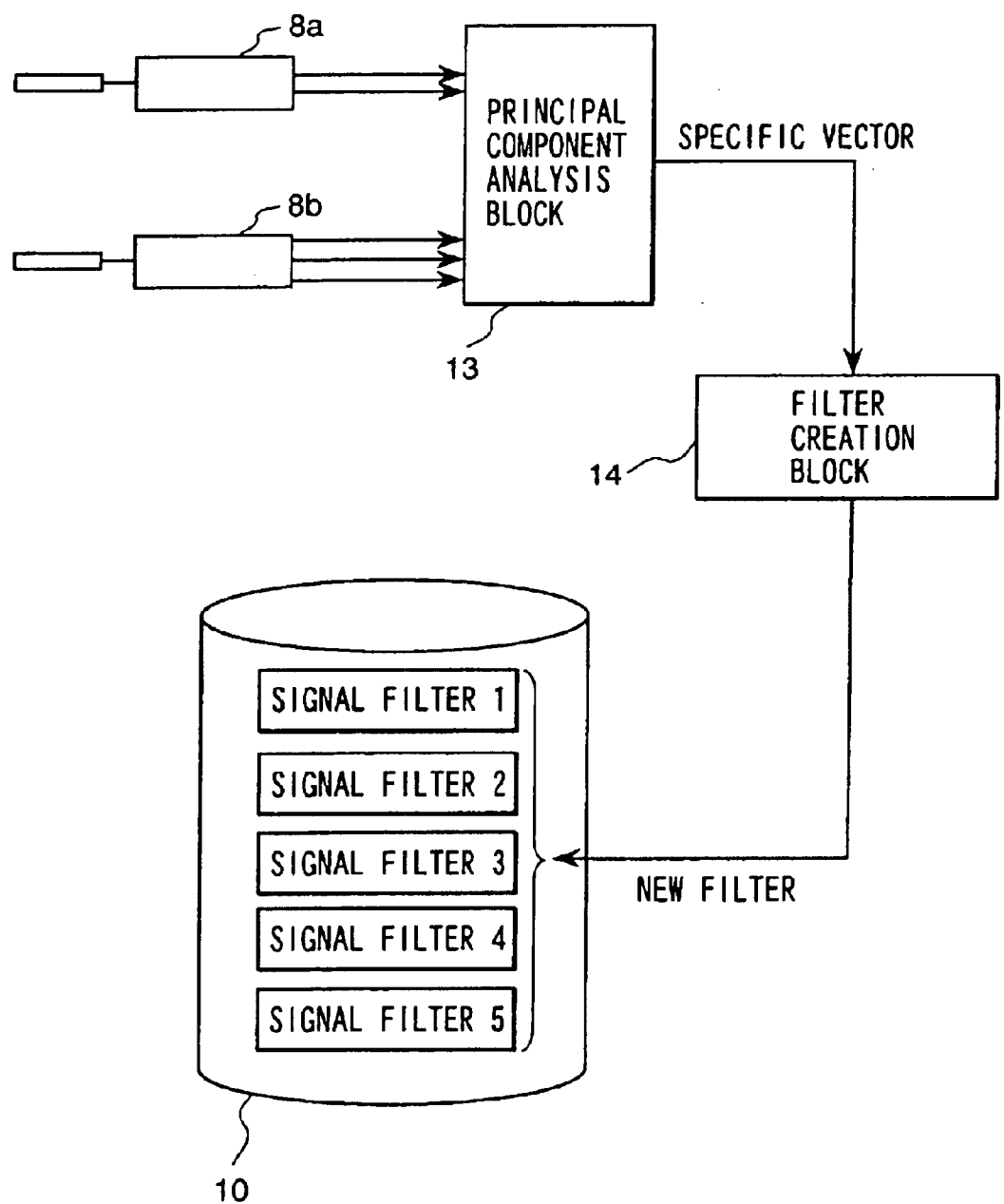
FIG. 3 is a schematic block diagram representing part of FIG. 1 which is characteristic of another embodiment of the present invention.

FIG. 3 shows a second embodiment of the present invention, more particularly, a data updating system. FIG. 3 contains main related parts of FIG. 1. The principal component analyzing means 13 receives signals from the status detecting means 8a and 8b and outputs an eigen vector as the result of analysis. The eigen vector is fed to the filter generating means 14 when the eigen vectors are to be combined, as explained above, although the eigen vectors can be directly stored as signal filters in the database. The filter generating means 14 generates a filter vector using formula 3 to add to or update the database 10.

Figure 4:
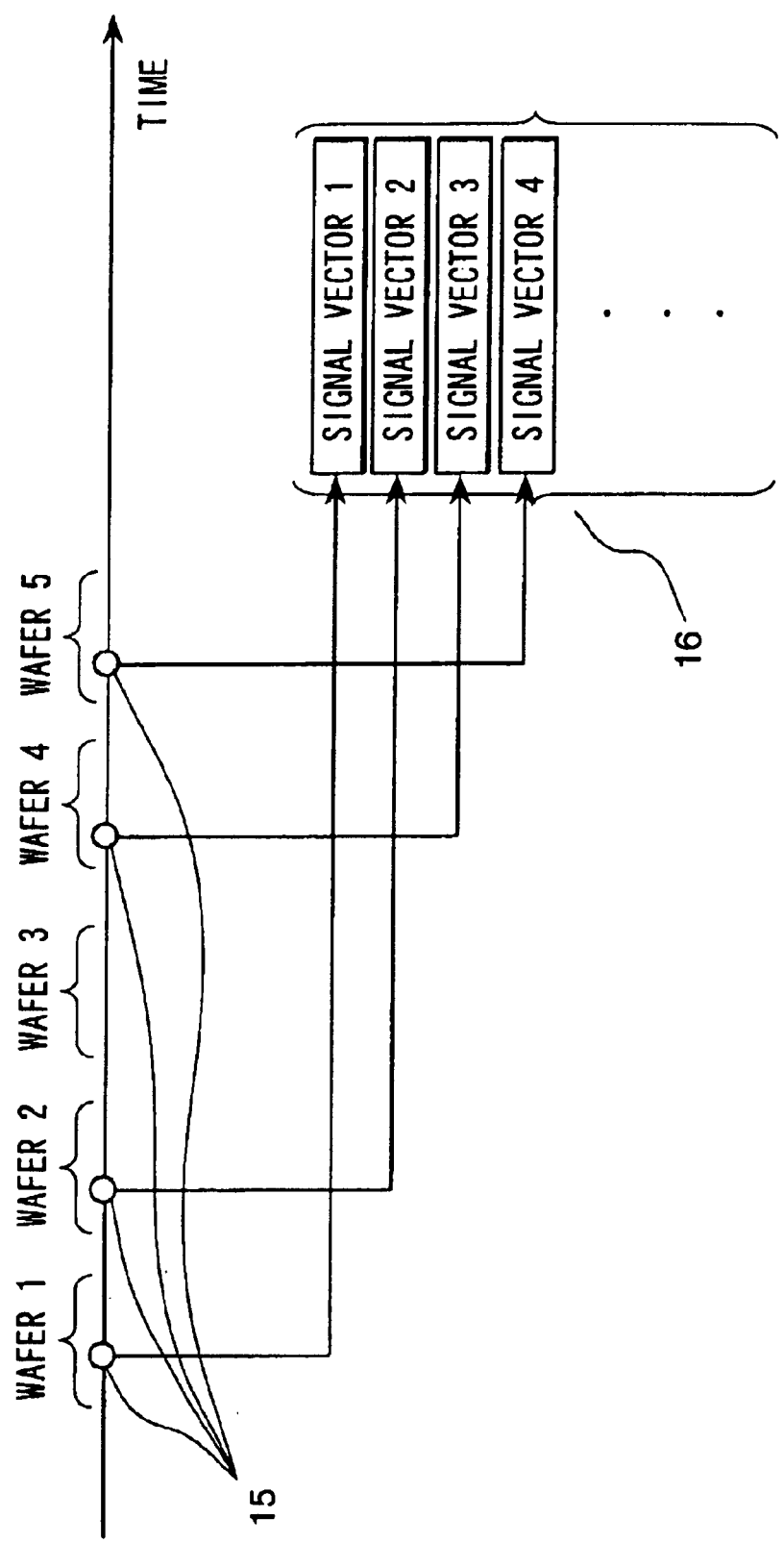
FIG. 4 is a timing diagram of a data sampling method for generation of a signal filter which represents another embodiment of the present invention.

There are various ways of sampling "m" pieces of signal data for the signal matrix "S" according to their needs. For example, as shown in FIG. 4, one way of sampling is to obtain data for every wafer at a preset sampling time point 15 and set the sampled data of each wafer (or the process transition of the wafers) in a signal matrix 16. Another way of sampling is to obtain some pieces of data in a selected time period during processing of a single wafer, repeat this for each of the other wafers, and set the sampled data of wafers in a signal matrix 16. Further, it is possible to create a signal matrix "S" of selected wafers in a lot in a selected time period because wafers are usually processed in a group (in a lot).

It is very important to determine a distribution of sampling time points which are suitable to obtain transitions of data as the principal component analysis determined eigen vectors according to the magnitude of fluctuations. For example, if the main component analyzer 13 takes all data which is output from the status detecting means at a rate of once per few seconds or higher from the beginning to the end of processing and sets all data in a signal matrix "S," only great status transitions in process steps having different step conditions, such as plasma ignition and plasma extinguishments, will be set into characteristic vectors and the other small, but important, transitions may be ignored. In such a case, small transitions in a long time period can be caught by obtaining only data of wafers of an identical process at identical process steps and setting them in the signal matrix "S." A signal filter which explicitly represents factors of status transitions can be created by using dummy wafers which are used for testing only, intentionally changing some process conditions according to a preset sequence, sampling a lot of signals from the status detecting means, creating a signal matrix "S" which represents process system responses to such intentional changes, and thus creating a signal filter.

It is also possible to detect changes in the device status by checking how the database is updated. For example, it is necessary only to monitor how the shape of the first characteristic vector corresponding to the greatest eigen value changes.

Figure 5:
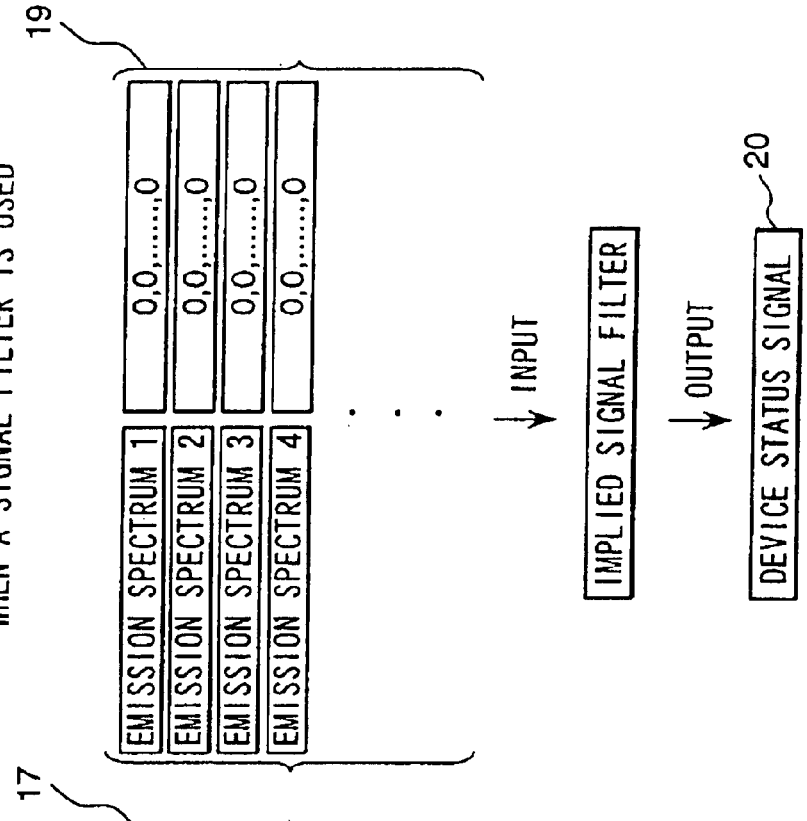
FIGS. 5(a) and 5(b) are diagrams illustrating creation of a signal matrix and a signal filter according to another embodiment of the present invention.

In some cases, the system can have a particular device status detecting means to create signal filters. For example, a manufacturer of a plasma processing apparatus installs both an emission spectrometer and a mass spectrometer on the plasma processing apparatus, prepares a signal matrix 17 containing sets of output signals of both the emission spectrometer and output signals of the mass spectrometer as signal vectors in an array, performs principal component analysis, and stores the resulting eigen vectors as signal filters 18 in a database, as shown in FIG. 5(a). As the signal patterns in one signal filter created from the result (eigen vectors) of the principal component analysis change with a very close correlation, emission spectrum parts of said signal filter represent physical and chemical phenomena indicated by the part of the mass spectrometer of the same signal filter. This method is effective because the mass spectroscopy is more convenient than the emission spectrum to identify a gas composition (as in analysis of some particular molecules). The plasma processing apparatus is shipped to the user without the mass spectrometer and is used in the actual manufacturing line with the mass spectroscopy data of the signal matrix 19 being zeros, as shown in FIG. 5(b). The obtained device status signal 20 acts like containing mass spectroscopy data, although the plasma processing apparatus is not actually equipped with any mass spectrometer. Thus, the signal filters in accordance with the present invention enable installation of a virtual instrument.

Further, the mechanism of a chemical reaction on the surface of the inner walls of the plasma process chamber and the like are complicated and the meaning of signals is hard to be determined. In such cases, it is preferable to analyze the surface reaction using numeric analysis, such as a molecular dynamics method, set the characteristics of the surface reaction in a database, and use them to give meaning to the signal filters.

Instead of generating signal filters in the plasma processing apparatus, as explained in the above example, it is also possible to update the signal filter database externally using a communication means connected to the plasma processing apparatus. This method is suitable for a manufacturing system whose semiconductor manufacturing equipment is collectively controlled by a central management center and the like.

Figures 6, 7:
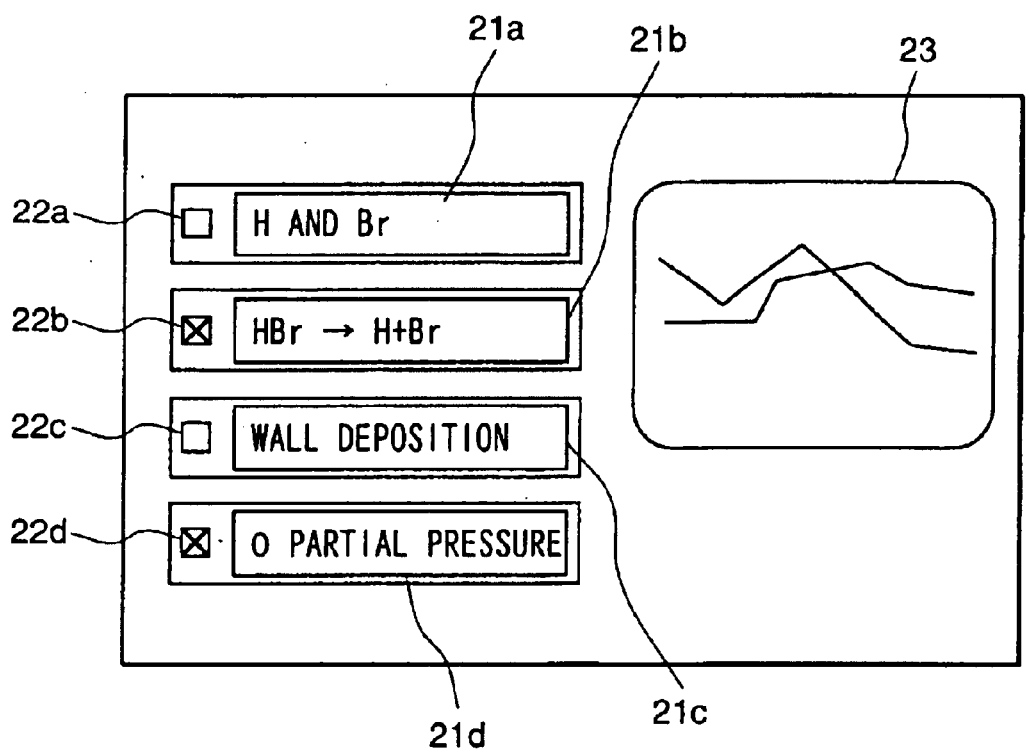
FIG. 6 is a diagram which represents an assignment of meanings to signal filters according to another embodiment of the present invention.
FIG. 7 is a diagram of a user interface according to another embodiment of the present invention.

When meanings are given to signal filters, a name table of the meanings of signal filters is created as shown in FIG. 6. The example of FIG. 6 represents a name table for etching of a silicon layer on a wafer by a process gas containing HBr gas.

FIG. 7 shows an example of a device interface as a next embodiment when signal filters are named. Here for this embodiment, "the meanings of signal filters" are called "device status." This interface has display units 21a, 21b, 21c, and 21d which respectively show signal filter meanings or device status. The operator selects a display unit (signal filter) which shows a phenomenon to be monitored and applies a check mark to its check box 22a, 22b, 22c, or 22d. With this, the display unit 23 graphically shows a transition of device status signals with time of the selected signal filter. It is also possible to feed back a device status signal selected on this interface to a device controller 12 in the manner shown in FIG. 1.

In some cases, the status of one device is represented by a plurality of device status signals. For example, when signal filter 1 and signal filter 2 are combined to represent the status of process chamber walls and when signal filter 2 and signal filter 4 are combined to represent the wafer processing status, device status signals are classified into groups and a selective interface as applied, as shown in FIG. 7.

Instead of the manual interface shown in FIG. 7, it is possible to select signal filers which are automatically displayed according to device status signals.

Figure 8:
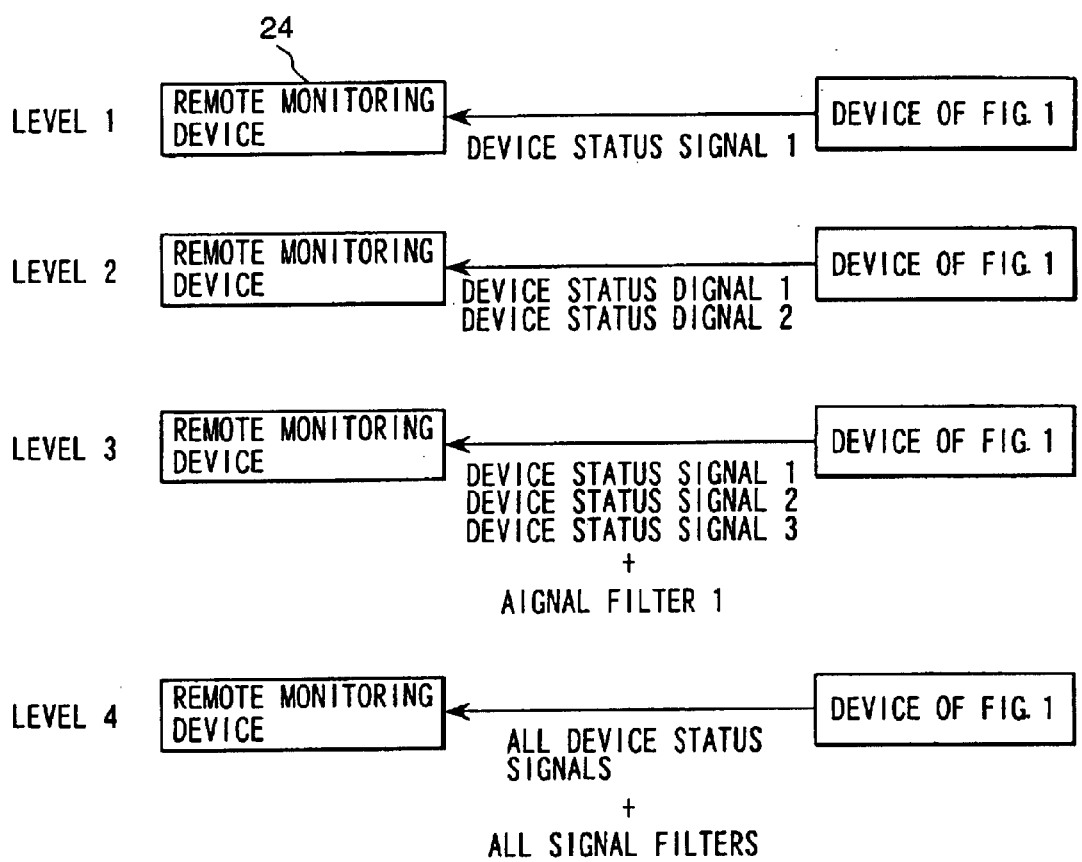
FIG. 8 is a diagram illustrating a remote diagnostic method according to another embodiment of the present invention.

FIG. 8 shows a remote monitoring system of the plasma processing apparatus of FIG. 1, which is a fourth embodiment of the present invention. Device states have some levels. For example, in a normal process status, only device status signal 1 is sent to the remote monitoring device 24 (at Level 1). When the remote monitoring device 24 detects an error in device status signal 1, the remote monitoring device enters Level 2 and requests the plasma processing apparatus to send device status signal 2 together with device status signal 1. If device status signals 1 and 2 are not sufficient to grasp the status of the device, the remote monitors device 24 enters Level 3 and requests the plasma processing apparatus to send more signals and a signal filter. Finally, when more data is required for analysis of a device error, the remote monitoring device 24 requests the plasma processing apparatus to send all device status signals and all signal filters.

Individual remote monitoring device 24 can request the plasma processing apparatus to stop when identifying the type of error or to clean the process chamber when the process chamber is contaminated too much. The plasma processing apparatus of FIG. 1 can be so designed as to reject a Send Data request of a preset level (security level to protect the process conditions against being open to the public) or higher from the remote monitoring device.

Figure 9:
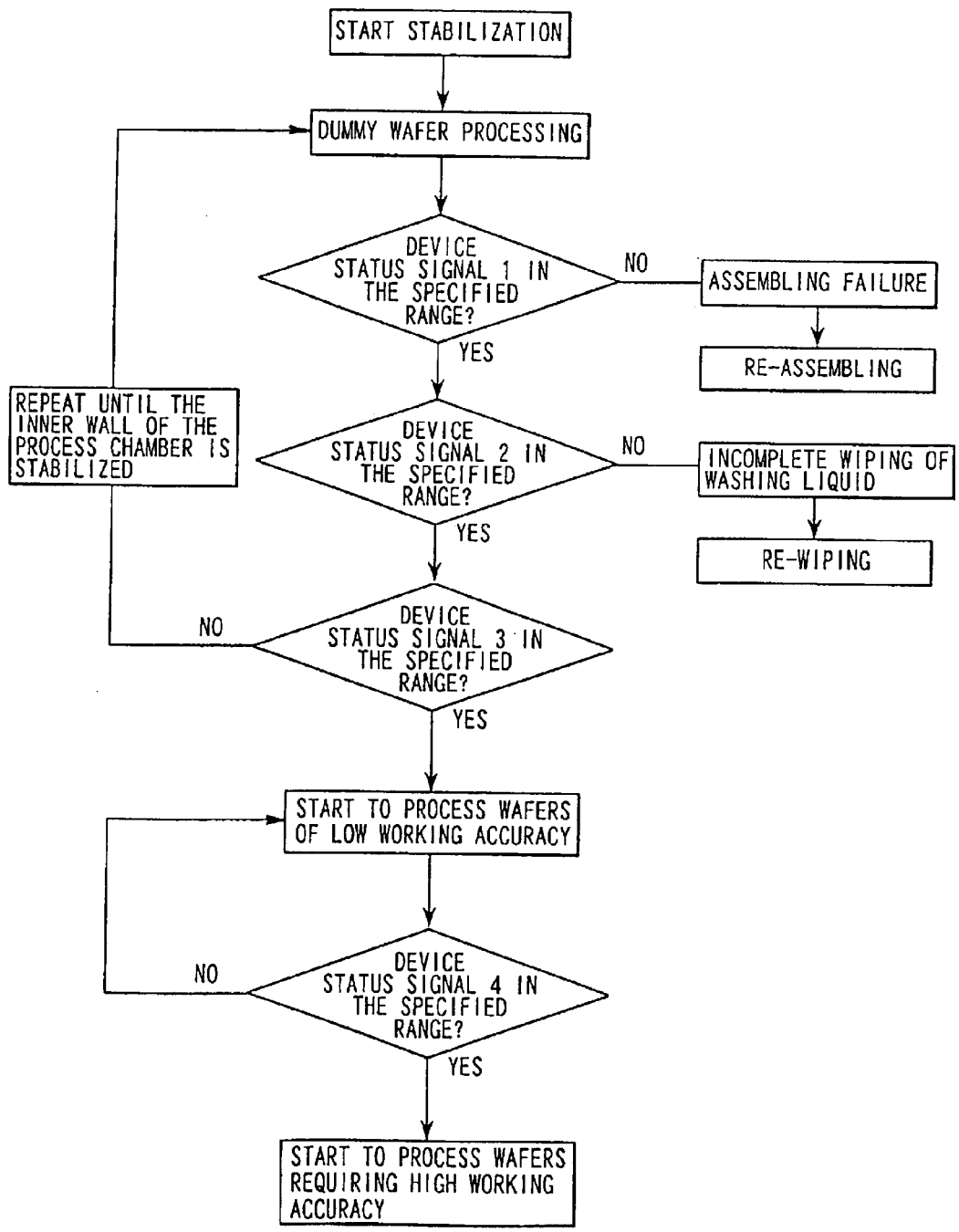
FIG. 9 is a flow chart of stabilization processing according to another embodiment of the present invention.

FIG. 9 shows a fifth embodiment of the present invention. As wafer processing advances, the deposit buildup inside of the process chamber of the plasma processing apparatus increases. Therefore, when a preset number of wafers are processed, the plasma processing apparatus requires disassembling and parts replacement or wet cleaning. After wet cleaning, the process chamber must be stabilized, because reassembling of the plasma processing apparatus is incomplete or the inner walls of the process chamber are not stable because of the washing liquid or the atmospheric air. The device status signals in accordance with the present invention are easily used for judgment of gradual stabilization of the plasma processing apparatus because the device status signals are arranged in the descending order of their eigen values. For example, as shown in FIG. 9, if device status signal 1 is not in a preset range after a few wafers are processed, this condition is taken as indicating that the status deviation is too big to be stabilized. This may be caused by leakage of air or incomplete assembling. So the assembling status of the system is checked.

Further, if the next device status signal 2 is not in a preset range, for example, if the washing liquid is incompletely wiped out, the wiping status is checked. When these checks are all right, the system repeats the dummy wafer plasma processing step to stabilize the inner walls of the process chamber until the device status signal 3 enters the preset range. When all the preset device status signals are in their preset ranges, the system finishes the stabilization and starts to check particle contamination and then goes on to process the product wafers. Or, in case the system has some wafers requiring different processing accuracy levels, the system starts to process wafers which can be processed at a lower accuracy level when the device status signals 1 to 3 enter their preset range. The system continues to monitor the value of the device status signal 4 and to process wafers requiring higher accuracy after device status signal 4 sets into the preset range. The system had better be designed to indicate that the system can process wafers of higher processing accuracies when the values enter the preset ranges.

In accordance with the present invention, as described above, a plasma processing apparatus having a process chamber to process specimens comprises status detecting means for detecting the internal processing status of the process chamber and outputting a plurality of signals, and signal converting means for extracting an arbitrary number of signal processing filters from a signal filter database by signal filter selecting means and creating as many device status signals as the filters selected. Further, signal converting means receives device status signals having a time series from the plasma processing apparatus which generates the device status signals and converts them into fewer effective device status signals. This enables easy exact supervision of a transition of the processing status.

The plasma processing apparatus comprises a mechanism which receives the device status signals and controls device states according to such device status signals. With this, the plasma processing apparatus can correct the transition of the processing status of the apparatus to carry out steady processing.

The plasma processing apparatus further comprises a display unit to display the transition of the device status signals as the time goes by. With this, the operator can see the device status change at a glance.

The plasma processing apparatus in accordance with the present invention can use means for dividing the light of said plasma according to wavelength as the status detecting means. This enables exact supervision of the plasma processing apparatus by a lot of light emission spectrum data, which is divided according to wavelengths.

Further, the plasma processing apparatus in accordance with the present invention can use means for detecting the electrical status of arbitrary points of the plasma processing apparatus. This enables supervision of the electrical status of the processing plasma.

Furthermore, the plasma processing apparatus in accordance with the present invention can use means for dividing said electrical status signals by frequencies. This enables higher-precision supervision of the electrical status of the processing plasma.

When equipped with a means for supplying power to the process chamber to generate plasma, the plasma processing apparatus can use means for detecting reflected components of power as the electrical status of the processing plasma. This enables supervision of the electrical status of the processing plasma.

When equipped with means for applying a light signal to the plasma, the plasma processing apparatus can detect the light signal which passes through or is reflected by the plasma by using status detecting means. This enables monitoring of compositions of gas molecules or the layer of deposits in the process chamber.

When equipped with a means for applying an electric signal to the plasma, the plasma processing apparatus can detect the electric signal which passes through or is reflected by the plasma using status detecting means. This enables monitoring of the plasma distribution and electric status of the plasma.

The plasma processing apparatus analyzes the result of processing of some specimens as signal filters by main components and uses them as specific vectors. This enables automatic creation of signal filters from a lot of supervision data according to the magnitude of fluctuations and reduction of signals to be supervised.

The plasma processing apparatus analyzes the result of processing of some specimens as signal filters by main components and combines the resulting specific vectors into a vector. This enables creation of signal filters whose physical and chemical meanings are clear, and thus enables easy troubleshooting of fluctuations.

The plasma processing apparatus updates the database by the result of processing of some specimens. This enables creation of signal filters specific to respective plasma processing apparatus and fine supervision of fluctuation of the plasma processing apparatus.

The plasma processing apparatus updates the database by the result obtained by processing specimens (called dummy wafers) except for normal processing wafers in a preset process sequence. This enables creation of signal filters which can make the causes of fluctuations clearer.

When equipped with a mechanism for monitoring how the database is updated, the plasma processing apparatus can supervise the transition of the status of the apparatus.

In the plasma processing apparatus, a certain status detecting means stops running or is removed from said apparatus after the database is created. This enables detection of device status by signal filters as well as the status detecting means, which are difficult to use in normal production lines.

The plasma processing apparatus obtains or updates the database by external communication. This enables remote diagnosis of the apparatus.

The plasma processing apparatus further comprises means for selecting one or more of said signal filters according to tags, such as numbers or names assigned to the signal filters. The device status signals by the selected signal filters are displayed, output, or used for device control. This enables easy selection of signal filters and supervision of the high number degrees of freedom.

The plasma processing apparatus has a list of pre-defined device states and a mechanism for selecting one device status from a device status list by device status signals. A device status is displayed or output. This enables any operator (even a beginning operator) to catch the device status at a glance.

The plasma processing apparatus varies the number of device status signals to be output or displayed according to the status of devices on the specimens. This enables exact and efficient supervision of the required number device status signals only when an error occurs. In other words, only a few basic device status signals need be supervised while the processing is normal.

The plasma processing apparatus varies the number of output device status signals in response to requests coming from outside the plasma processing apparatus. This enables the remote supervisor to specify signals to be checked on the production site.

The plasma processing apparatus can be equipped with a judging mechanism which checks whether each device status signal is in a preset range and changes the operating status of the apparatus (e.g. cleaning the apparatus, replacement of parts, or start of specimen processing) according to the result of judgment. This restarts the apparatus efficiently and smoothly after washing.

The plasma processing apparatus can be equipped with a judging mechanism which operates as means for selecting a specimen among specimens of different processing accuracies to be processed on a single plasma processing apparatus according to the result of judgment. This enables the apparatus to be used for processing immediately after washing.

What is claimed:

1. A plasma processing apparatus having a process chamber to process one or more specimens, comprising:
    a first status detecting unit which detects the processing status, inside of the process chamber;
    a database containing signal processing filters created using first output signals from the first status detecting unit and second output signals from a second status detecting unit which is different from the first status detecting unit; and
    a signal conversion unit arranged to create first device status signals from the first output signals,
    wherein the first device status signals have time series which are less than the first output signals.

2. The plasma processing apparatus in accordance with claim 1, comprising:
    a mechanism which creates second device status signals from the first output signals, wherein the second device status signals are related to the second status detecting unit that is equipped on the plasma processing apparatus.

3. The plasma processing apparatus in accordance with claim 1, wherein the first status detecting unit is a spectroscope, and the second status detecting unit is a mass spectrograph.

4. The plasma processing apparatus in accordance with claim 2, the first status detecting unit is a spectroscope, and the second status detecting unit is a mass spectrograph.

5. The plasma processing apparatus in accordance with claim 1, wherein the first status detecting unit is an electric status detector installed in plasma generating means, and the second status detecting unit is a spectrometer installed in the process chamber to detect light emitted from plasma in the process chamber.

6. The plasma processing apparatus in accordance with claim 1, wherein the first status detecting unit is an electric status detector installed in plasma generating means, and the second status detecting unit is a laser induced fluorescent means or an infrared absorption means to detect light passing through or reflected by plasma in the process chamber.

7. The plasma processing apparatus in accordance with claim 1, further comprising a display unit arranged to display the transition of the first device status signals over a designated time period.

8. The plasma processing apparatus in accordance with claim 1, further comprising means for adding electrical signals to plasma generated in the process chamber, wherein said first status detecting unit is adapted to detect changes when the electrical signals pass through the plasma or are reflected by the plasma.

9. A plasma processing apparatus comprising:
   a process chamber to process a specimen;
   a first status detecting unit to detect the processing status of each device on the specimen inside of the process chamber and generate first output signals;
   a database containing signal processing filters created using the first output signals and second output signals from a second status detecting unit different from the first status detecting unit; and
   a signal conversion unit to convert first device status signals from the first output signals, wherein said first device status signals have time series which are less than said first output signals.

10. The plasma processing apparatus in accordance with claim 9, comprising:
    a mechanism which creates second device status signals from the first output signals, wherein the second device status signals are related to the second status detecting unit that is equipped on the plasma processing apparatus.

11. The plasma processing apparatus in accordance with claim 9, wherein the first status detecting unit is a spectroscope, and the second status detecting unit is a mass spectrograph.

12. The plasma processing apparatus in accordance with claim 9, wherein the first status detecting unit is an electric status detector installed in plasma generating means, and the second status detecting unit is a spectrometer installed in the process chamber to detect light emitted from plasma in the process chamber.

13. The plasma processing apparatus in accordance with claim 9, wherein the first status detecting unit is an electric status detector installed in plasma generating means, and the second status detecting unit is a laser induced fluorescent means or an infrared absorption means to detect light passing through or reflected by plasma in the process chamber.

14. The plasma processing apparatus in accordance with claim 9, further comprising a display unit arranged to display the transition of the first device status signals over a designated time period.

15. The plasma processing apparatus in accordance with claim 9, further comprising means for adding electrical signals to plasma generated in the process chamber, wherein said first status detecting unit is adapted to detect changes when the electrical signals pass through the plasma or are reflected by the plasma.

* * * * *